United States Patent [19]

Iwatare

[11] Patent Number: 5,773,755

[45] Date of Patent: Jun. 30, 1998

[54] PROTECTIVE CASING STRUCTURE FOR ELECTRONIC APPARATUS

[75] Inventor: Misao Iwatare, Tokyo, Japan

[73] Assignee: NEC Corporation, Tokyo, Japan

[21] Appl. No.: 656,074

[22] Filed: May 31, 1996

[30] Foreign Application Priority Data

Jun. 1, 1995 [JP] Japan ................................. 7-134903

[51] Int. Cl.$^6$ .................................................. H05K 7/20
[52] U.S. Cl. ...................................... 174/17 VA; 361/695
[58] Field of Search ............................. 174/17 VA, 16.3, 174/16.1; 361/688, 690–697, 676, 831; 218/105, 106, 109

[56] References Cited

U.S. PATENT DOCUMENTS

| 2,927,736 | 3/1960 | Rohatyn | 236/49 |
| 4,495,545 | 1/1985 | Dufresne et al. | 361/384 |
| 4,817,912 | 4/1989 | McCabe | 251/11 |
| 5,491,610 | 2/1996 | Mok et al. | 361/695 |
| 5,544,012 | 8/1996 | Koike | 361/695 |

FOREIGN PATENT DOCUMENTS

| 3516989 A1 | 11/1986 | Germany | G06F 1/00 |
| 3543486 A1 | 11/1987 | Germany | H01C 7/20 |

*Primary Examiner*—Kristine L. Kincaid
*Assistant Examiner*—Joseph Waks
*Attorney, Agent, or Firm*—Scully, Scott, Murphy & Presser

[57] ABSTRACT

A double wall casing structure includes an inner casing for housing heat generating equipment and an outer casing surrounding the inner casing to form an air layer therebetween. One or more fans are provided in the air layer and are operated temperature-responsively for steering air within the air layer. At lest one selectively operable valve is located in the outer casing. The valve is adapted to be automatically closed/opened responsive to sensed temperature conditions.

6 Claims, 3 Drawing Sheets

PROTECTIVE CASING STRUCTURE FOR ELECTRONIC APPARATUS

BACKGROUND OF THE INVENTION

The present invention relates to a protective casing for housing an electronic apparatus such as communication equipment including elements which generate heat and, particularly, to a protective casing structure for outdoor equipment, which has a temperature regulating function.

A conventional protective casing for outdoor equipment usually has a sealed structure for a purpose of protection of the equipment inside thereof. When the casing has a single wall structure, heat generated by the equipment which is a heat generator inside the casing is easily dissipated externally by heat conduction of the wall if an external air temperature is low. However, when the external temperature is high or the casing itself is heated by solar energy directly, an internal air temperature of the casing rises due to the internal heat generation and the external heating. Therefore, it is usual to provide a sunshade for the casing having the single wall structure or employs a double wall casing structure.

A conventional double wall casing structure for outdoor equipment utilizes heat insulating properties of an air layer between inner and outer casings of the structure to prevent external heat from being transmitted to an interior of the casing structure. Further, at least a vent hole is provided in the outer casing to discharge air between the inner and outer casings which is heated by the equipment to a temperature higher than that of external air and introduce the latter air thereto.

In the above-mentioned double wall casing structure, however, there are problems that heat discharge rate is low since heat discharge from an outer wall surface of the inner casing is based on a circulation of air due to natural convection of air in the air layer between the inner and outer casings and heat transmission from external air to the interior of the casing structure is not blocked enough since air in the air layer between the inner and outer casings is in communication with external air through the vent hole. Therefore, it is impossible to obtain expected effects of discharge of internally generated heat and prevention of heat transmission from external air.

SUMMARY OF THE INVENTION

An object of the present invention is to provide a double wall protective casing for outdoor equipment, which can prevent external heat from transmitting thereto and efficiently discharge internally generated heat.

According to the present invention, a protective casing for outdoor equipment which generates heat has a double wall structure constructed with inner and outer casings. At least a fan is provided in a space between the inner and outer casings for steering air in an air layer formed in the space. Further, at least one selectively openable valve is provided in a wall surface of the outer casing.

A plurality of fans may be provided in the air layer, and a temperature sensor and a control device may be provided for automatically operating the fan or fans when a temperature of air in the air layer exceeds a predetermined value or an internal temperature of the inner casing exceeds a predetermined value.

A temperature sensor and a control device may be provided for automatically closing the selectively openable valve provided in the wall of the outer casing when an inner temperature of the casing is equal to or lower than a predetermined temperature and opening when the temperature is higher than the predetermined temperature. The valve may have a mechanism including a bimetal element which automatically closes the valve at a temperature equal to or lower than a predetermined temperature and opens it at a temperature higher than the predetermined temperature.

Since, when an inner temperature of the inner casing becomes equal to or lower than the predetermined temperature, the fan or fans stops to operate and the valve is closed, the space defined between the inner and outer casings is in a sealed state in which air in the air layer merely circulates therein due to natural convection. Therefore, the circulating air constitutes a heat insulating layer for preventing heat from being transmitted thereto from an external high or low temperature air.

When the inner temperature of the inner casing increases and the fans start to operate, air in the air layer is circulates while being steered, resulting in forced convection. Therefore, the heat transmission rate thereof with respect to the wall surfaces of the casings is increased and a temperature gradient in the air layer is reduced, so that outward heat discharge from the casing structure increases and an inner temperature increase of the casing structure is restricted.

When the valves are opened, air in the air layer becomes in communication with external air, resulting in reduction of temperature difference therebetween. The communication of the air in the air layer with external air is promoted by the fans, so that the temperature of air in the air layer becomes external air temperature within a short time.

BRIEF DESCRIPTION OF THE DRAWINGS

The above and other objects, features and advantages of the present invention will become apparent from the following detailed description when taken with the accompanying drawings in which.

In the drawings, identical reference numerals denote identical structural elements.

DETAILED DESCRIPTION OF THE PREFERRED EMBODIMENTS

An embodiment of the present invention will be described with reference to FIGS. 1 to 5.

Figure 1:
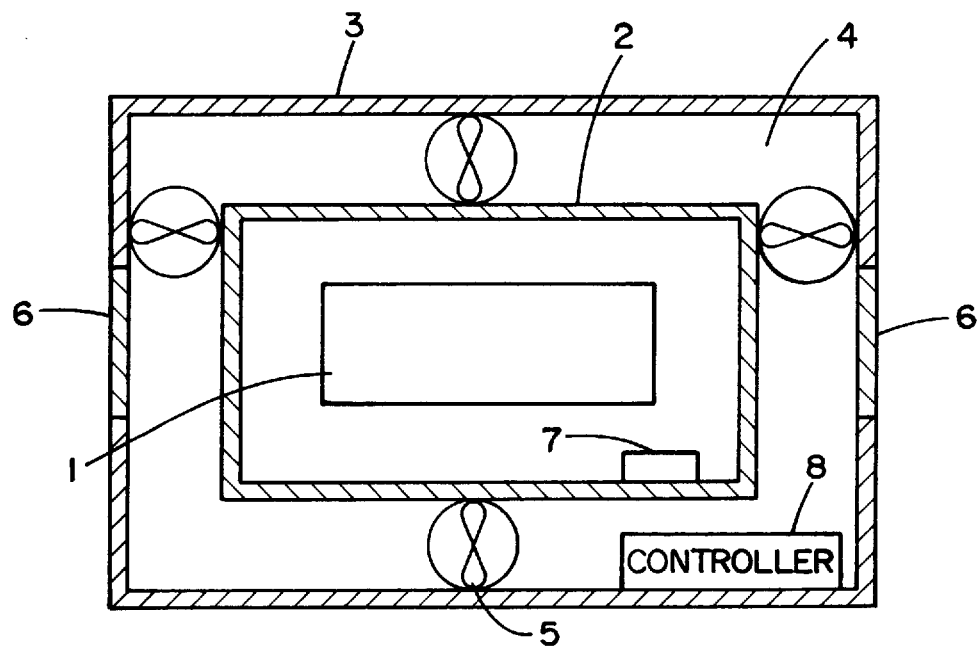
FIG. 1 is a cross section of an embodiment of a double wall casing structure for outdoor equipment according to the present invention.
Figure 4:
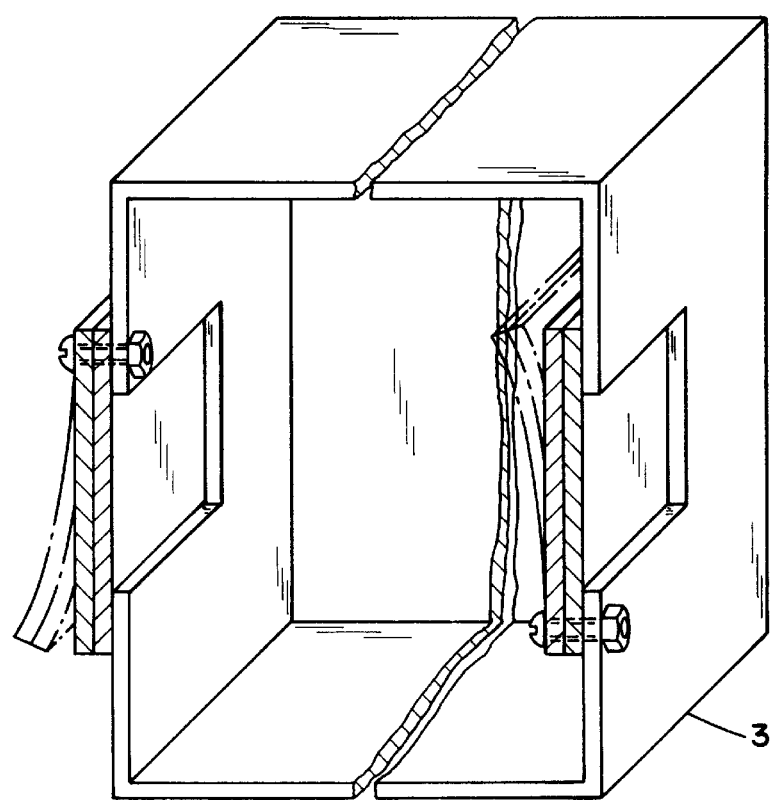
FIG. 4 is a perspective view showing bimetal valves fixed to the outer casings.

In FIG. 1, the double wall casing structure according to the present invention includes an inner casing 2 having a heat generator 1 such as a communication device therein and an outer casing 3 provided externally of the inner casing 2. A plurality of fans 5 for steering air in an air layer 4 are provided in a space between the inner and outer casings 2 and 3. Further, as shown in FIG. 4, valves 6 of bimetal which are normally closed and automatically opened when a temperature of the air layer 4 or an inner temperature of the inner casing 2 exceeds a predetermined temperature are provided in a wall of the outer casing 3.

The predetermined temperature at which the bimetal valves 6 are opened is usually set to a temperature higher than a temperature at which the fans 5 start to operate.

Since, in this embodiment, the bimetal valves 6 are usually closed, the inner and outer casings 2 and 3 are usually sealed and so air in the air layer 4 is separated from environmental air. It should be noted that a distance between the inner and outer casings 2 and 3 is made large enough to reduce an influence of heat radiation to each other. The size and materials of the casings 2 and 3 are designed to control an inner temperature of the inner casing 2 in the predetermined range while considering an ambient temperature of places where the casings 2 and 3 are arranged. The fans 5 are controlled by a controller 8 which responds to a temperature sensor 7 provided within the casing 2 such that they operate when the temperature of the casing 2 becomes higher than the operating temperature Ta (FIG. 5) and stop to operate when it becomes lower than the operating temperature.

Figure 5:
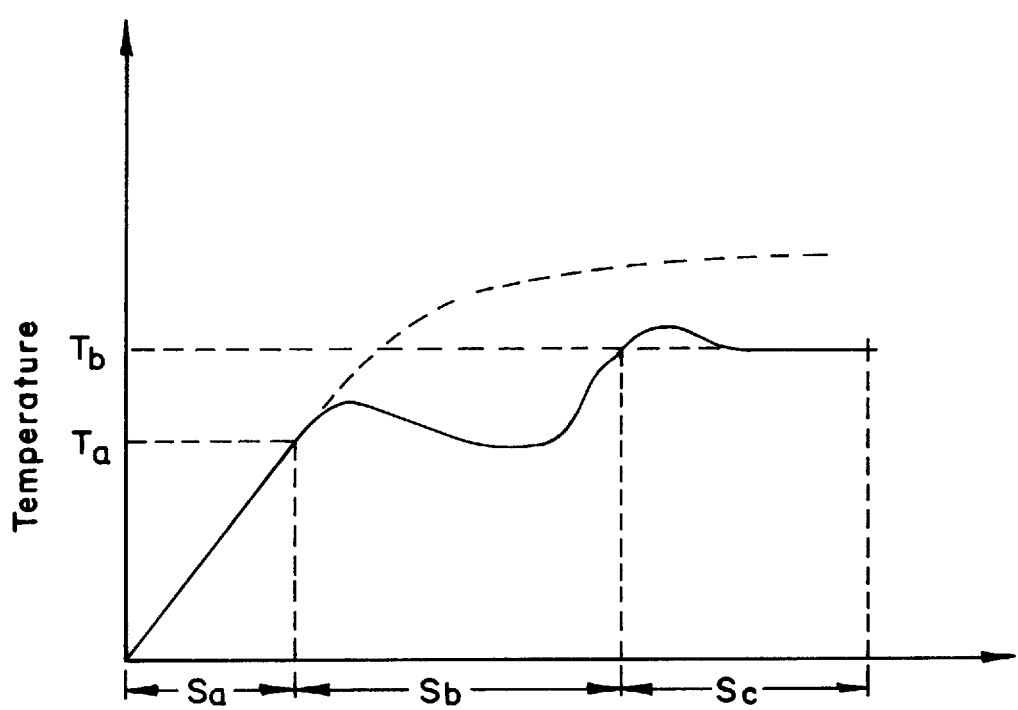
FIG. 5 is a graph for explaining an operation of the fan and the valve.

When the ambient temperature is low and heat generated by the heat generator 1 within the inner casing 2 is substantially radiated externally by heat transmission through natural convection of air in the air layer 4 and heat radiation from an outer surface of the outer casing 3, the temperature of the casing 2 is kept lower than the setting temperature of the temperature sensor 7 and the fans 5 do not operate (Section Sa of FIG. 5).

Since, according to this embodiment, an interior of the outer casing 3 is not opened externally when the external air is at a temperature low enough to damage the internal equipment unlike the conventional structure and the air layer 4 is separated from the external air, the air layer 4 acts as a heat insulator to prevent an internal temperature of the inner casing 2 from being lowered.

Figure 2:
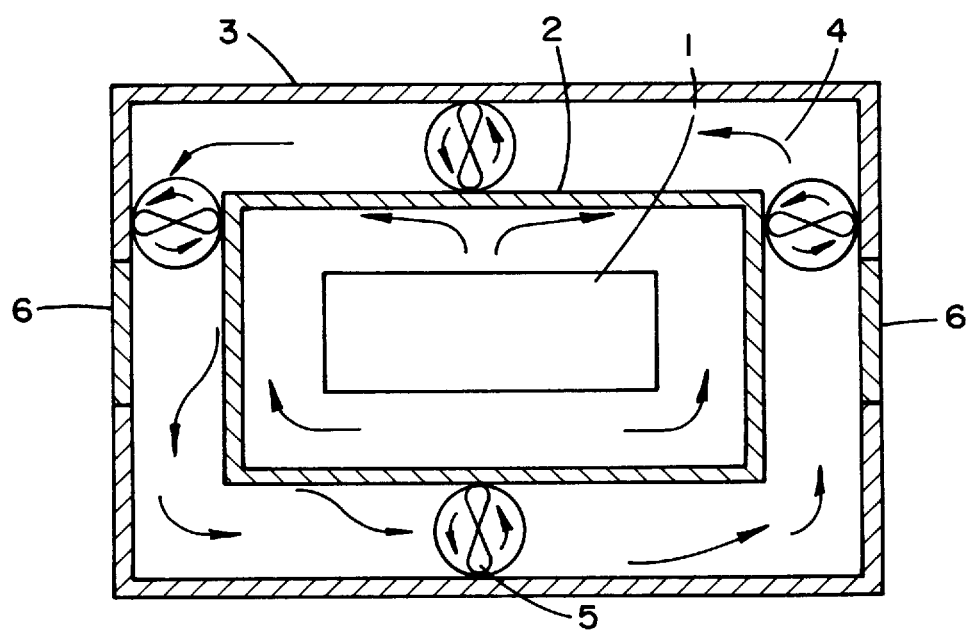
FIG. 2 is a cross section of the double wall casing structure in FIG. 1, showing a state in which fans are operating.

When the external air temperature increases, a temperature difference between the external air and the air layer 4 is gradually decreases. Therefore, an amount of heat radiated through the outer casing 3 is gradually decreased and the inner temperature of the inner casing 2 as well as the air layer 4 gradually increases. Further, when an amount of heat generated by the heat generator 1 increases, the temperature of the inner casing 2 as well as the air layer 4 gradually increases. When the temperature of the inner casing rises above the setting temperature Ta of the temperature sensor 7, the fans 5 start to steer air in the air layer 4 to thereby circulate it through the space between the inner and outer casings 2 and 3, as shown in FIG. 2. Thus, the temperature gradient in the air layer 4 is gradually disappeared and a moving speed of air in the air layer 4 with respect to wall surfaces of the casings is increased. Therefore, heat transmission rate between the air layer 4 and an inner wall of the outer casing 3 as well as an outer wall of the inner casing 2 is increased and so the amount of heat radiation from the air layer 4 to the external air is increased, so that temperature increase of the air layer 4 and of the interior of the inner casing 2 is restricted (Section Sb of FIG. 5).

Figure 3:
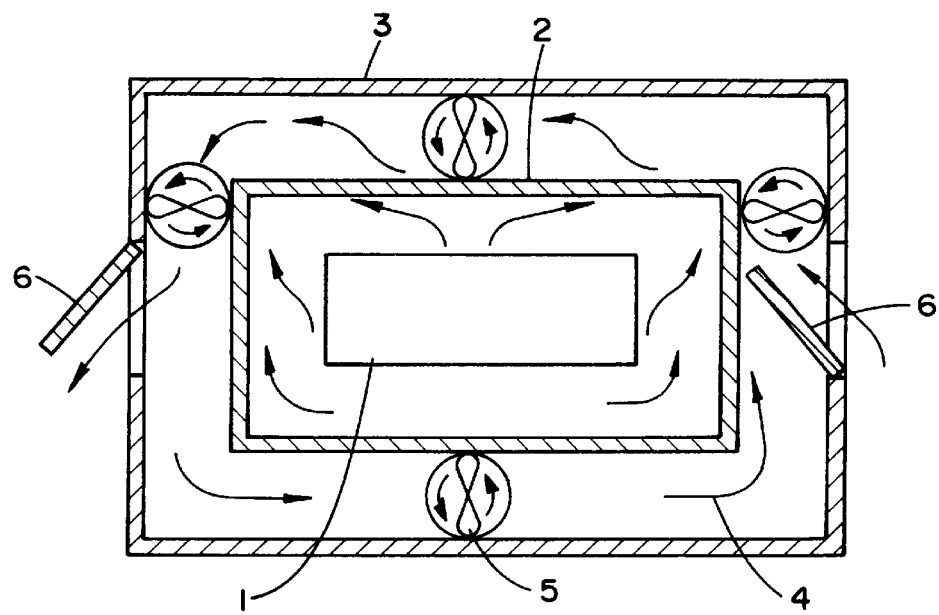
FIG. 3 is a cross section of the double wall casing structure in FIG. 2, showing a state in which bimetal valves are opened.

When the external air temperature is further increased or the amount of heat generation of the heat generator 1 is further increased and when the temperature of the inner casing 2 rises above the setting temperature Tb and the temperature of the air layer 4 exceeds that of the bimetal valves 6, the valves 6 are automatically opened by deformation, allowing the air layer 4 to communicate with external air, as shown in FIG. 3. Air in the air layer 4 at a higher temperature than the external air temperature is discharged forcibly through the opened valves 6 and lower temperature external air is taken into the air layer between the inner and outer casings 2 and 3 by the action of the fans 5, resulting in that the temperature of the air layer 4 is reduced rapidly to the external air temperature (Section Sc of FIG. 5).

It should be noted that the characteristic of the dotted line shows one of the conventional double wall casing. In addition, the operating temperature of the valves 6 is determined based on the inner temperature of the casing, an amount of the air layer 4 and the power of the fan 5, etc.

Since, in this embodiment, one of the bimetal valves 6 is opened outward and the other is opened inward when the air layer temperature is increased, as shown in FIG. 3, external air is positively introduced into the air layer 4 by the fans 5 through the inward opened bimetal valve 6 so that air of an upper portion of the air layer 4 whose temperature is maximum is discharged externally through the outward opened bimetal valve 6. However, this structure of the casing is a mere example and the arrangement of the bimetal valves 6 and opening directions thereof may be any so long as a desired air communication between the air layer and external air is possible.

Further, although the valves 6 are of bimetal in this embodiment, it may be possible to use a shape memory alloy for these valves or to construct the valves with using a usual metal material and control them manually or by cylinders electrically operated by an output signal from a temperature sensor provided separately from that for the fans.

Although, in this embodiment, the temperature sensor 7 for controlling the fans 5 is provided in the inner casing 2, it may be provided in the air layer 4 or in both. Alternatively, the fans 5 may be controlled manually.

In the double wall casing structure for outdoor equipment according to the present invention, the fans provided within the double wall casing structure are stopped to operate when the temperature of the interior of the casing structure housing the heat generating equipment is equal to or lower than the predetermined temperature, while the valves provided in the outer wall of the outer casing are closed. Therefore, the interior of the double wall casing structure is in the sealed state and, since air of the air layer merely circulate by natural convection, the air layer forms a heat insulating layer for preventing external heat at high or low temperature from being introduced in the interior of the casing structure.

Therefore, transmission of heat caused by external high temperature air or direct irradiation of solar energy to the casing structure is restricted, so that increase of temperature of the internal equipment can be prevented. Further, even when external air is at a temperature which is low enough to adversely affect an operation of the equipment housed in the double wall casing structure, outward heat radiation from the casing structure is restricted and the adverse effect of low temperature of the equipment can be avoided.

When the internal temperature is increased and the fans start to operate, air in the air layer between the inner and outer casings is steered and circulated, resulting in forced convection. Therefore, the heat transmission rate with respect to the wall surfaces is increased and the temperature gradient within the air layer is reduced. Consequently, outward heat radiation is increased and thus the temperature increase in the interior of the double wall casing structure is restricted.

Further, when the valves provided in the outer casing are opened, air of the air layer between the inner and outer casings is in communication with external air, so that the temperature difference therebetween is reduced. When the fans are in operation in this state, the communication between air in the air layer and external air is promoted, so that the temperature of air in the air layer rapidly approaches that of external air. Therefore, the outer wall surface of the inner casing becomes in contact with external air to promote heat radiation and thus the temperature increase of the housed equipment is prevented.

What is claimed is:

1. A double wall casing structure for electronic apparatus having heat generating elements radiating heat through said casing structure, comprising:

an inner casing for housing said apparatus;

an outer casing surrounding said inner casing in spaced relationship so as to define an air layer extending all about and between said inner casing and said outer casing, said air layer being defined by an inner surface of a wall of said outer casing and an outer surface of a wall of said inner casing and being normally insulated from an external ambient air;

at least one fan provided in said air layer, said at least one fan being selectively operative responsive to first predetermined sensed temperature conditions for steering and circulating air in said air layer; and at least one, selectively openable valve which is controlled in response to second predetermined sensed temperature conditions provided in said wall of said outer casing, said second predetermined sensed temperature conditions being set higher than said first predetermined sensed temperature conditions whereby upon sensed temperature in said outer casing wall reaching said second predetermined temperature conditions said valve opens so as to communicate said air layer with said external ambient air.

2. A double wall casing structure claimed in claim 1, wherein a plurality of said fans are provided in said air layer.

3. A double wall casing structure claimed in claim 1, further comprising temperature sensor means and control means for automatically operating said at least one fan when an internal temperature of said double wall casing structure exceeds a predetermined temperature.

4. A double wall casing structure claimed in claim 2, further comprising temperature sensor means and control means for automatically operating said plurality of fans when an internal temperature within said inner casing exceeds a predetermined temperature.

5. A double wall casing structure claimed in claim 1, further comprising temperature sensor means and control means for automatically closing said selectively openable valve at a temperature equal to or lower than a predetermined temperature and automatically opening said selectively openable valve at a temperature above said predetermined temperature.

6. A double wall casing structure claimed in claim 5, wherein said selectively openable valve comprises a bimetal element, said bimetal element including a mechanism for automatically closing said valve at a temperature equal to or lower than said predetermined temperature and automatically opening said valve at a temperature above said predetermined temperature.

* * * * *